US009905395B2

(12) United States Patent
Stegmaier

(10) Patent No.: US 9,905,395 B2
(45) Date of Patent: Feb. 27, 2018

(54) METHOD FOR STRUCTURING AN OBJECT WITH THE AID OF A PARTICLE BEAM APPARATUS

(71) Applicant: Carl Zeiss Microscopy GmbH, Jena (DE)

(72) Inventor: Simon Stegmaier, Korb (DE)

(73) Assignee: Carl Zeiss Microscopy GmbH, Jena (DE)

( * ) Notice: Subject to any disclaimer, the term of this patent is extended or adjusted under 35 U.S.C. 154(b) by 168 days.

(21) Appl. No.: 14/867,304

(22) Filed: Sep. 28, 2015

(65) Prior Publication Data

US 2016/0090645 A1    Mar. 31, 2016

(30) Foreign Application Priority Data

Sep. 30, 2014  (DE) .................. 10 2014 014 572

(51) Int. Cl.
*B44C 1/22* (2006.01)
*H01J 37/304* (2006.01)
*C23C 16/04* (2006.01)
*C23C 16/52* (2006.01)

(52) U.S. Cl.
CPC .......... *H01J 37/304* (2013.01); *C23C 16/047* (2013.01); *C23C 16/52* (2013.01); *H01J 2237/30433* (2013.01); *H01J 2237/3174* (2013.01)

(58) Field of Classification Search
CPC ... H01L 2924/0002; H01L 2224/05552; H01L 2224/0231; H01L 2224/0401; H01L 2224/05005; H01L 2224/0501; H01L 2224/0502; C23C 16/047; C23C 16/52; H01J 2237/30433; H01J 2237/3174; H01J 37/304
USPC .................. 216/60.65, 66, 85, 94
See application file for complete search history.

(56) References Cited

U.S. PATENT DOCUMENTS

| 7,977,654 | B2 | 7/2011 | Sunaoshi | |
|---|---|---|---|---|
| 8,653,487 | B2 | 2/2014 | Sunaoshi | |
| 9,443,697 | B2 * | 9/2016 | Rue | |
| 2004/0203249 | A1 * | 10/2004 | Huynh | C23F 4/00 438/723 |
| 2005/0177811 | A1 * | 8/2005 | Kotani | H01L 22/20 716/53 |
| 2012/0274757 | A1 * | 11/2012 | Bai | H01J 37/244 348/79 |
| 2013/0187064 | A1 | 7/2013 | Zeile et al. | |
| 2014/0061032 | A1 * | 3/2014 | Miller | G01N 1/32 204/192.33 |

FOREIGN PATENT DOCUMENTS

DE    10 2012 001 267 A1    7/2013

OTHER PUBLICATIONS

German Office Action, with translation thereof, for corresponding DE application No. 10 2014 014 572.7 dated Jul. 14, 2015.

* cited by examiner

*Primary Examiner* — Lan Vinh
(74) *Attorney, Agent, or Firm* — Fish & Richardson P.C.

(57) ABSTRACT

Methods for structuring objects with a particle beam apparatus are disclosed.

20 Claims, 2 Drawing Sheets

METHOD FOR STRUCTURING AN OBJECT WITH THE AID OF A PARTICLE BEAM APPARATUS

CROSS-REFERENCE TO RELATED APPLICATION

This patent application claims benefit under 35 U.S.C. § 119 of German patent application 10 2014 014 572.7, filed Sep. 30, 2014, the entire contents of which are incorporate herein by reference.

FIELD

The disclosure relates to methods for structuring objects with the aid of particle beam apparatuses.

BACKGROUND

Particle beam apparatuses can be used to structure objects. For this purpose, a particle beam generated by the particle beam apparatus is directed at selectable locations on the object. Material can be removed from the object at these locations, or material can be deposited on the object at these locations. The removal of material can be achieved by the particle beam being directed onto the object with a sufficient energy to remove material from the object. This process is also referred to as particle beam etching. The removal of material can also be supported by a process gas being guided to the impingement location, which process gas is activated by the particle beam and forms compounds with components of the object, which compounds can be removed from the object. The deposition of material on the object can be achieved by a suitable process gas being fed to the object at the impingement location of the particle beam, the process gas being activated by the particle beam and the activation products thereof leading to a desired material deposition on the object.

The techniques described make it possible to form miniaturized structures on an object with high precision with the aid of a particle beam apparatus. It is also possible for the result of the processing by the particle beam to be repeatedly checked by using the particle beam apparatus being as a microscope to record an image of the structure that was just formed. In a manner dependent on a comparison of the recorded image with a desired result, the further progression of the process for forming a desired structure on the object can then be controlled iteratively.

SUMMARY

It can be complicated to find values and settings of process parameters that characterize the operation of the particle beam apparatus, use of which has the effect that a desired structure is formed on the object, and use of which has the effect that the desired structure can be formed as rapidly and reliably and as possible without involving iterative checking by repeatedly recording an image of the structure formed.

The present disclosure proposes a method for structuring an object using at least one particle beam apparatus which makes it possible to reliably form a desired structure on an object.

In the development of methods for forming a desired structure on a given object with the aid of a particle beam apparatus, series of experiments are usually carried out in which values of process parameters characterizing the operation of the particle beam apparatus are varied and a multiplicity of test structures are formed on the object with parameters varied in each case. Afterwards, the test structures formed can be examined in order to understand the influence of the varied process parameters on the structure formed, and it is possible to ascertain one of the test structures which comes close to a desired result. The process parameters used for forming this ascertained test structure can then subsequently be used to form a desired structure, which can also be referred to as a used structure, on a different object.

For this purpose, it is desirable to know the process parameters that were used when forming the ascertained test structure. Suitable recordings and logs make it possible to maintain an assignment between test structures produced and the process parameters used for this purpose and, after ascertaining a suitable test structure, to ascertain the used process parameters on the basis of this assignment.

Often, test structures are formed and stored for a relatively long time in order later, if the objective for forming a specific desired used structure has arisen, once again to inspect the test structures and to establish whether, for instance, one of the test structures produced earlier has properties and features which at least partly correspond to the properties and features of the used structure now to be formed, such that the process parameters which were used when forming the test structure can also be used as process parameters for forming the used structure now desired.

There can be a problem with maintaining the assignment between formed test structures and the process parameters used for forming them for a relatively long time and, if appropriate, across different locations and involved institutions and persons.

The disclosure therefore provides, when forming a first structure on a first object, which first structure can be a test structure, for forming on the first object a further, second structure, which is an information structure and represents the values of the process parameters which are used when forming the test structures with the aid of the particle beam apparatus. The information structure can represent the values of the process parameters used for forming the assigned used structure. This can be carried out, for example, by the values being coded according to a predetermined method, such that they are represented by a sequence of information units. It is then possible to form the sequence of information units as an information structure on the object via a corresponding element of the information structure being formed on the object for each information unit of the coded values, which element represents the respective information unit. By way of example, for representing the values, two different information units ("bits") can be provided which are represented by two different and distinguishable elements of the information structure. The two elements of the information structure can be realized for example as depressions in the surface of the object, wherein the two elements differ with regard to a depth of the depressions or a lateral extent of the depressions. It is then subsequently possible to detect and to analyse the information structure in order to determine the values of the process parameters which are represented by the information structure.

In this way, the process parameters used for forming test structures are stored permanently together with the test structures on the same object, such that the test structures can be stored for later analysis, wherein it is always possible to ascertain the process parameters used for forming a determined test structure by virtue of the information structure assigned to the determined test structure being detected and analysed.

In accordance with exemplary embodiments, the method for structuring an object using at least one particle beam apparatus includes determining a first structure to be formed on a first object; determining a first set of values of a plurality of first process parameters of the at least one particle beam apparatus in a manner dependent on the first structure; forming the first structure on the first object using the at least one particle beam apparatus using the first set of values of the first process parameters; determining a second structure to be formed on the first object, the second structure being assigned to the first structure and representing the first set of values of the first process parameters; forming the second structure on the first object using the at least one particle beam apparatus; determining a third structure to be formed on a second object; detecting the second structure formed on the first object; analysing the detected second structure and determining the first set of values of the first process parameters represented by the detected second structure; determining a second set of values of the plurality of first process parameters on the basis of the determined first set of values of the first process parameters; and forming the third structure on the second object using the at least one particle beam apparatus using the second set of values of the first process parameters.

The particle beam apparatus can be an ion beam apparatus and/or an electron beam apparatus. It is also possible to use a system including a plurality of particle beam apparatuses for forming a desired structure. By way of example, it is possible to use a system which includes an ion beam apparatus and an electron beam apparatus which can direct their particle beams simultaneously onto an identical processing location on an object. Such a system makes it possible, in a simple manner, to achieve an efficient formation of desired structures with the aid of the ion beam apparatus and to achieve a checking of the structure formed with the aid of the electron beam apparatus operated as a microscope. The process parameters for characterizing the particle beam apparatus used for forming a desired structure on an object can be diverse. The process parameters can include at least one parameter describing the particle beam used for forming the test structure. This parameter can describe for example a kinetic energy of the particles of the particle beam that impinge on the object, it can describe a beam current of the particle beam, it can describe a diameter of the particle beam impinging on the object, or it can describe a working distance between the object and the particle beam apparatus.

The process parameters can furthermore include a parameter describing a process gas used when forming the test structure. This parameter can describe a chemical composition of the process gas, it can describe a pressure of the process gas that is present for example in a gas feeding system for feeding the process gas to the object, or it can describe a mass flow rate of the process gas that is fed to the object.

The process parameters can furthermore include a parameter describing a scan strategy used when forming the test structure. For forming the structures, the particle beam is usually scanned over the object, wherein the particle beam can be switched on and off or can be directed only at selected locations within a writing field.

The process parameters can also contain parameters describing the geometry of the structure to be formed. Such parameters can be specified for example as coordinates in a coordinate system of the particle beam apparatus or as coordinates relative to a reference position defined with respect to the structure to be formed. This does not rule out the fact that the structure actually produced with these parameters, on account of tolerances and process-governed deviations, such as, for example, increased or decreased material removal rates or material deposition rates, or on account of a redeposition of removed material in the region of the structure to be produced, can be described by geometry parameters which deviate from the parameters describing the geometry of the structure to be produced. The process parameters can also contain parameters describing a vacuum pressure in a vacuum space containing the first object when forming the first structure. Furthermore, the process parameters can also contain parameters describing a gas flow of a gas which is fed to the first object in order to avoid charging of the first object when forming the first structure. Furthermore, the process parameters can also contain parameters describing a temperature of the first object when forming the first structure. Furthermore, the process parameters can also contain parameters describing an electrical potential of the first object relative to the particle beam apparatus when forming the first structure. Furthermore, the process parameters can also contain parameters describing a crystal orientation of the first object relative to the particle beam apparatus when forming the first structure. Furthermore, the process parameters can also contain parameters describing a change in a focus setting of the particle beam apparatus during the process of forming the first structure.

The sequence of measures for scanning the object can be designated as a scan strategy. Parameters describing the latter are, for example, the size of the scan field, such as, for example, the horizontal or vertical extent thereof, a set magnification of the particle beam apparatus, a distance between scanning points that are used when forming the structure, a residence duration of the particle beam at each scanning point, a duration of a scan pass carried out repeatedly, a number of such scan passes, a pause between successive scan passes, and the like.

The process parameters can furthermore include a parameter describing a position and/or an orientation of the object relative to the particle beam apparatus used for forming the test structure. Furthermore, the process parameter can include an identification symbol of the particle beam apparatus used for forming the test structure. This can be helpful if different particle beam apparatuses are used for forming the test structure and for subsequently forming the used structure. The different particle beam apparatuses can belong to an identical type and merely be different entities of this type. It is possible here for the apparatuses to yield different results even given an identical setting of the values of their process parameters. By storing the identification symbol of the particle beam apparatus used for forming the test structure, it is then possible to detect such differences and to determine, for the particle beam apparatus used for forming the used structure, suitable values of the process parameters to be used. Even if the particle beam apparatus used for forming the used structure is of a type that differs from the type of the particle apparatus which was used for forming the test structure, the stored identification symbol is helpful in order to perform suitable adaptations of the values of the parameters which can be used for operating the particle beam apparatus for producing the used structure.

Furthermore, it is possible to combine the values of a plurality of process parameters which occur frequently in their combination, for example, and to designate them by an identification symbol whose value as parameter describes the process parameters. It is thereby possible to reduce the size of the information structure on the object.

In accordance with exemplary embodiments, a multiplicity of sets of values of the process parameters are determined, wherein the sets of values differ from one another in pairs. A plurality of test structures can then be formed on the object, wherein each of the test structures is formed using a different set of values of the process parameters. The multiplicity of test structures correspondingly formed on the object thus represent a series of experiments in which one or a plurality of the process parameters are varied. Here, too, for each of the test structures, an information structure assigned thereto is formed on the object, wherein each of the information structures represents the values of the set of values of the process parameters which were used to form the test structure assigned to the relevant information structure.

In accordance with exemplary embodiments, later, that is to say after the test structures have been formed, a used structure to be formed which has specific properties is determined. The properties can be for example geometrical properties, such as, for example, dimensions and angles between elements of the used structure. The properties can also be material properties, such as, for example, the material of the object on which the used structure is intended to be formed, or the material which is intended to be deposited on the object.

Afterwards, the test structures formed previously are analysed and compared with the desired used structure with regard to their properties. If a sufficiently similar test structure was found, the latter is selected. Afterwards, the information structure assigned to the selected test structure is detected and analysed in order to ascertain the process parameters which were used for forming the selected test structure. In this case, it is not necessary, in particular, also to detect the information structures which are not assigned to selected test structures.

BRIEF DESCRIPTION OF THE DRAWINGS

Embodiments of the disclosure are explained in greater detail below with reference to figures, in which.

DETAILED DESCRIPTION

Figure 1:
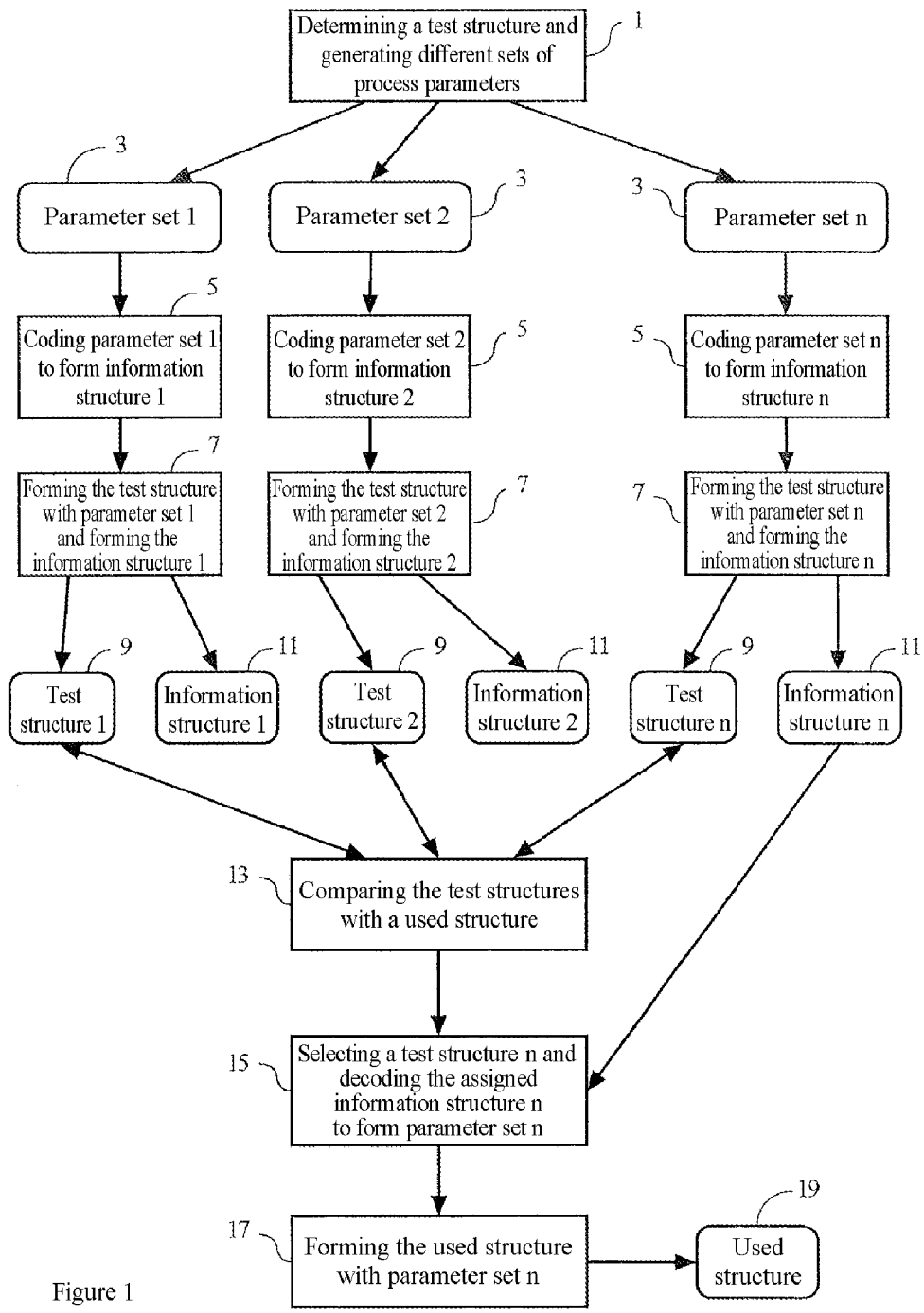
FIG. 1 shows a flow diagram of a method for structuring an object using at least one particle beam apparatus.

One embodiment of a method for structuring an object using a particle beam apparatus is explained below with reference to the flow diagram in FIG. 1. The method described uses a particle beam apparatus or a system of particle beam apparatuses in order to form a desired structure on an object, the desired structure being designated hereinafter as used structure.

One example of a system of particle beam apparatuses which can be used for implementing the method can be gathered from DE 10 2012 001 267 A1, the disclosure of which in its full scope is incorporated in the present patent application.

The used structure is desired by a customer, for example, and has desired properties. The desired properties can be geometrical properties or material properties. The geometrical properties describe the spatial arrangement of the structure for example by length indications including, for example, distances between different elements of the structure or angles that different elements of the structure are intended to have relative to other elements of the structure. The material properties describe for example a chemical composition of elements of the structure or a configuration of the material, such as, for example, crystalline, amorphous, or a density of the material.

An objective thus then consists in forming the used structure having the desired properties on an object with the aid of the particle beam apparatus or the system of particle beam apparatuses. Forming the used structure includes removing material from the object and depositing material on the object, wherein these processes are controlled by the particle beam generated by the particle beam apparatus. It is correspondingly desirable to define values of process parameters which describe the manner of operation of the particle beam apparatus. The process parameters can include for example a parameter describing the particle beam used for forming the used structure. Furthermore, the process parameters can include a parameter describing a scan strategy for forming the used structure on the object. The process parameters can furthermore include parameters describing pauses between successive steps of the method for forming the used structure on the object. The process parameters can furthermore include parameters describing a position and/or orientation of the object relative to the particle beam apparatus used for forming the used structure. Furthermore, the process parameters can include parameters describing the use of process gases which are activated by the particle beam and lead to the deposition of material on the object or to the removal of material from the object. The process parameters can also include parameters describing the geometry of the used structure, for example as coordinates in a suitable coordinate system.

Finding the values of the process parameters which, if they are used for forming the desired used structure using the particle beam apparatus, lead to the desired result is complex. In the example described here, therefore, series of experiments with test structures and varied sets of values of process parameters were carried out in order, if a desired used structure is to be formed, to ascertain suitable sets of values of the process parameters on the basis of the test structures.

In a step 1 in the flow diagram in FIG. 1, a test structure is determined. The test structure can have a simple geometrical structure, such as that of a parallelepiped, for example, which is intended to be deposited from a specific material, such as gold, for example, on a specific object, composed of silicon, for example. On the basis of experience gained previously, a set of values of process parameters that appear suitable is determined. The values of the set of values are then varied in order to obtain a multiplicity of sets of values of process parameters which differ from one another in pairs. By way of example, the values of three different process parameters are varied in four steps, such that, for each of the three process parameters, five different values are present and 5×5×5=125 different sets of values of process parameters 3 are generated.

In a step 5, the values of each set of the process parameters are coded digitally, for example, and an information structure which can be formed on the object and which represents the coded values is determined. This is carried out in such a way that the information structure formed later on the object can be detected and analysed in order to obtain the set of values of the process parameters from the information structure by decoding. For this purpose, the test structure can have two different geometrical elements representing the two states of bits in the digital representation of the values. In this regard, for example, a small depression can represent the set bit and a deeper depression can represent the non-set bit. A bit sequence of the values then corresponds to a sequence of such geometrical elements which are arranged in a predetermined order in the information structure. The information structure can furthermore include marking elements which allow an unambiguous orientation and subsequent assignment of the sequence of elements to the bit sequence. One example of such an information structure is the conventional QR code. The elements of the structure that represent the bits are formed in such a way that they can be recognized later using an electron microscope, for example.

The test structures and the information structures assigned to the test structures are formed on the object in steps 7. In this case, a number of different test structures corresponding to the number of different sets of values of the process parameters are formed on the object. The test structures differ from one another at any rate since they were formed using different values of the process parameters. However, it is possible that the differences between individual test structures can be established only with difficulty or cannot be established at all using conventional or available measurement methods. However, it is possible that these differences will nevertheless be able to be ascertained using future measurement methods. Via steps 7, therefore, a multiplicity of test structures 9 and a corresponding number of information structures 11 assigned to the test structures are produced. The test structures 9 can be formed on identical or different objects in one work operation. However, each individual test structure together with the information structure assigned thereto is formed on the same object, such that the assignment between test structure and information structure is permanent. The assignment can consist, for example, in the fact that an information structure is always arranged on the object in a predetermined relation relative to the test structure. By way of example, information structures can always be formed at the bottom right alongside the respective test structure. It is also possible for the test structures 9 and assigned information structures 11 to be formed individually or in groups at long time intervals on different objects which are stored in a warehouse and form the basis for forming a desired used structure at a later point in time.

In order to form a desired used structure, in a step 13 the desired used structure is compared with the test structures 9. This can be carried out, for example, by images of the test structures 9 being recorded by an electron microscope, parameters of interest being determined from the images by measurement and being compared with corresponding parameters of the used structure. In the case of substantial correspondence, it is assumed that the test structure for which the substantial correspondence occurs was formed using process parameters which are also suitable for forming the desired used structure. This set of values of the process parameters is ascertained in a step 15, which involves detecting the information structure assigned to the selected test structure. The information structure is detected and analysed in step 15, wherein detecting includes for example recording an image of the information structure using an electron microscope, and analysing includes evaluating the recorded image in order to obtain, by decoding the image content, the set of values of process parameters which were used to form the selected test structure. This set of values of process parameters then forms the basis for the subsequent process of forming the used structure in a step 17, in which the used structure 19 is formed on an object. In order to form the used structure on the object, the set of values of process parameters ascertained in step 15 can be used directly, or it is possible to use a set of values of process parameters which is generated on the basis of the set of values of process parameters determined in step 15 by modification thereof. By way of example, the used structure has properties which correspond to specific properties of the selected test structure and other properties which do not correspond to the properties of the selected test structure. The values of the process parameters from the set of values obtained in step 15 are then preferably accepted about which it can be assumed that they lead to the desired properties of the used structure. In order to produce other properties of the used structure, which are not found in the selected test structure, values of parameters which differ from the corresponding values of the process parameters which were used for forming the selected test structure can correspondingly be used when forming the used structure.

It is possible, in the context of the development of a desired used structure, for a property thereof to acquire a great importance which previously had not yet been known as a significant property. It is therefore certainly not the case that even detailed logs concerning test structures produced in the past have information concerning these properties. Nevertheless, with the method described above it is possible to have recourse to test structures produced earlier and to examine them with regard to the newly found property. This examination can be carried out with the aid of measurements on the test structures produced in the past. If a test structure having the desired new property is then found, it is directly possible also to ascertain the values of the process parameters with which this selected test structure was formed. Specifically, the values of the process parameters can be obtained by decoding the information structure assigned to the test structure and can be used for the subsequent formation of the used structure having the then newly arisen property.

In this case, it is possible for the information structure generated in step 5 of FIG. 1 to be generated automatically, for example by a control computer of the particle beam apparatus, by virtue of the software of the control computer directly using the values of the process parameters which are used for forming the test structure, and coding them to form the information structure. As a result, the information structure finally formed on the object is an automatically generated structure whose appearance cannot be influenced by the user of the particle beam apparatus. In this respect, the information structure is stable relative to the possible occurence of human errors on the part of the user. This also constitutes a difference between the information structure and the test structure or used structure, which, namely, can be predefined by the user. Therefore, an error on the part of the user can have the effect that the test structure or used structure has an incorrect shape. However, the process parameters used for forming this incorrect shape of the test structure are coded without errors and automatically to form the information structure, which is then likewise formed without errors on the object.

Selecting the test structure in step 15 can be carried out, for example, by the user recording one or a plurality of images of the test structures using an electron microscope, for example. If a suitable test structure is identified, it is selected by the pictorial representation of the test structure and/or of the information structure assigned thereto being marked in a user interface of the electron beam microscope using an input device, such as a computer mouse, for example. The electron microscope can thereupon record a detailed image of the associated information structure and decode the information structure in order to determine the values of the process parameters. The determined values of the process parameters can then be accepted by the control software of the particle beam apparatus and used for forming the used structure. It is furthermore possible to transmit the determined values of the process parameters to a different particle beam apparatus. This can be carried out for example by transmission via a network or by the values of the process parameters being sent by email, for example, to a user of the different particle beam apparatus. Furthermore, the information structure can be represented on the screen after image processing with ideal contrast, such as, for example, exclusively with the colours black and white. A user can photograph the representation of the information structure using his/her smartphone, for example, and send it to the user of a different particle beam apparatus, as is possible for example by via so-called QR codes in other fields of technology.

Figure 2:
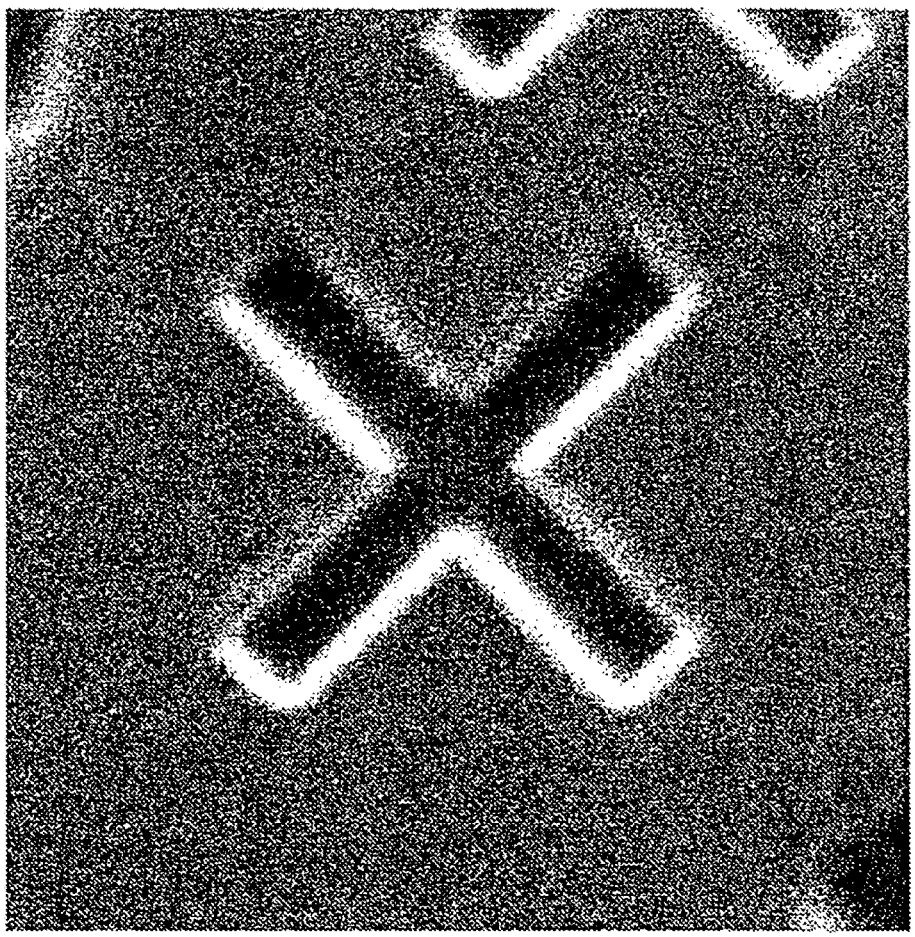
FIG. 2 shows an image—captured by an electron microscope—of one example of a structure formed on an object.

FIG. 2 shows one example of a test structure formed on an object. The test structure has the shape of a cross formed as a depression in the object. Values of parameters which describe the geometry of the structure and in particular the lateral extent thereof on the object can be represented as coordinates relative to the structure to be produced for example by the following parameter set that defines a polygon progression surrounding two strips crossing one another:

```
<POLYGON points="(14.7009 -9.53764) (17.3879 -6.85064)
(7.56874 2.9685) (17.3879 12.7876)
(14.7009 15.4746) (4.88173 5.65551) (-4.9374
15.4746) (-7.62441 12.7876) (2.19473 2.9685)
(-7.62441 -6.85064) (-4.9374 -9.53764) (4.88173
0.281496) " contours="0 ">
```

In this example, the object consists of silicon, and the depth of the structure consisting of the two strips crossing one another is 5 µm.

Values of parameters which describe the scan strategy and particle dose used can be represented by the following parameter set:

```
<EXPOSURE version="2.1" column_type="FIB"
purpose="FIB milling" computed_parameter="cycles"
dwell_times_point="1e-006 s"
dwell_times_line="1e-006 s" dwell_times_area="1e-
006 s" dwell_times_image="1e-006 s"
delay="medium" cycle_delay="0 s"
dose_image="0 C/m²" dose_area="100 C/m²"
dose_line="0 C/m" dose_point="0 C" pause="false"
scanning_mode_fast="by purpose"
scanning_mode_cycle_mode="by purpose"
pixel_spacing_image="0 m"
pixel_spacing_area="50 %"
pixel_spacing_line="0 m" track_spacing="50 %"
description="">
```

Values of parameters which describe the particle beam used can be represented by the following parameter set:

```
<PROBE name="30kV:1nA" type="specific"
current="1e-009 A" diameter="1.2e-008 m"/>
```

These exemplary parameter sets can be written to the object together with further parameter sets in a suitable coding as information structure alongside the test structure.

To summarize, therefore, a method for structuring an object using at least one particle beam apparatus is proposed, including determining a test structure to be formed on a first object; determining first process parameters of the at least one particle beam apparatus; forming the test structure on the first object using the first process parameters; determining an information structure to be formed on the first object, the information structure being assigned to the test structure and representing the first process parameters; forming the information structure on the first object; determining a used structure to be formed on a second object; detecting the information structured formed on the first object; analysing the detected information structure and determining the first process parameters represented by the detected information structure; determining process parameters on the basis of the determined first process parameters; and forming the used structure using the determined process parameters.

The invention claimed is:

1. A method of structuring an object using at least one particle beam apparatus, the method comprising:
   determining a first structure to be formed on a first object;
   determining, based on the first structure, a first set of values of a plurality of first process parameters of the at least one particle beam apparatus;
   forming the first structure on the first object using the at least one particle beam apparatus using the first set of values of the first process parameters;
   determining a second structure to be formed on the first object, the second structure being assigned to the first structure and representing the first set of values of the first process parameters;
   forming the second structure on the first object using the at least one particle beam apparatus;
   determining a third structure to be formed on a second object;
   detecting the second structure formed on the first object;
   analysing the detected second structure and determining the first set of values of the first process parameters represented by the detected second structure;
   determining a second set of values of the plurality of first process parameters based on the determined first set of values of the first process parameters; and
   forming the third structure on the second object using the at least one particle beam apparatus using the second set of values of the first process parameters.

2. The method of claim 1, wherein the at least one particle beam apparatus comprises an ion beam apparatus and/or an electron beam apparatus.

3. The method of claim 2, wherein the plurality of process parameters comprise at least one of the following:
   a parameter describing the particle beam used for forming the first structure;
   a parameter a describing a geometry of the first structure;
   a parameter describing a writing field size used when forming the first structure;
   a parameter describing a particle dose used for forming the first structure;
   a parameter describing a spacing of scanning points used when forming the first structure;
   a parameter describing a scan strategy used when forming the first structure;
   a parameter describing a duration of a scan pass that is used when forming the first structure, the scan pass being carried out repeatedly;
   a parameter describing a number of scan passes carried out repeatedly when forming the first structure;

a parameter describing a pause between successive scan processes that are used for forming the first structure;

a parameter describing a process gas used when forming the first structure;

a parameter describing a position of the first object relative to the particle beam apparatus used for forming the first structure;

a parameter describing a orientation of the first object relative to the particle beam apparatus used for forming the first structure;

a parameter describing a vacuum pressure in a vacuum space containing the first object when forming the first structure;

a parameter describing a gas flow for avoiding charging of the first object when forming the first structure;

a parameter describing a temperature of the first object when forming the first structure;

a parameter describing an electrical potential of the first object relative to the particle beam apparatus when forming the first structure;

a parameter describing a crystal orientation of the first object relative to the particle beam apparatus when forming the first structure; and a parameter describing a change in a focus setting of the particle beam apparatus during the process of forming the first structure.

4. The method of claim 3, wherein the second structure comprises at least member selected from the group consisting of an identification symbol for a plurality of predetermined parameters and an identification symbol of the particle beam apparatus used for forming the first structure.

5. The method of claim 3, wherein the at least one parameter describing the particle beam used for forming the first structure comprises at least one of the following:

a parameter describing a kinetic energy of the particles of the particle beam that impinge on the object;

a parameter describing a beam current of the particle beam;

a parameter describing a diameter of the particle beam impinging on the object; and a parameter describing a working distance between the first object and the particle beam apparatus.

6. The method of claim 3, wherein the at least one parameter describing the process gas used when forming the first structure comprises at least one of the following:

a parameter describing a chemical composition of the process gas;

a parameter describing a pressure of the process gas; and a parameter describing a mass flow rate of the process gas.

7. The method of claim 3, further comprising:

determining a multiplicity of sets of values of the first process parameters, wherein each set of values differs from each other set of values with regard to at least one of the values;

forming a multiplicity of the first structures on the first object, wherein each of the structures is formed using a different set of values of the first process parameter; and forming a multiplicity of the second structures on the first object, wherein each of the second structures represents a different set of the values of the process parameters.

8. The method of claim 3, further comprising forming a multiplicity of first structures on one or more first objects using different first sets of the values of the first process parameters, wherein the method comprises:

detecting the multiplicity of the first structures;

comparing the detected first structures with the third structure to be formed on the second object, and selecting one of the first structures; and detecting the second structure assigned to the selected first structure, wherein a plurality of the second structures which are not assigned to selected first structures are not detected.

9. The method of claim 1, wherein the plurality of process parameters comprise at least one of the following:

a parameter describing the particle beam used for forming the first structure;

a parameter a describing a geometry of the first structure;

a parameter describing a writing field size used when forming the first structure;

a parameter describing a particle dose used for forming the first structure;

a parameter describing a spacing of scanning points used when forming the first structure;

a parameter describing a scan strategy used when forming the first structure;

a parameter describing a duration of a scan pass that is used when forming the first structure, the scan pass being carried out repeatedly;

a parameter describing a number of scan passes carried out repeatedly when forming the first structure;

a parameter describing a pause between successive scan processes that are used for forming the first structure;

a parameter describing a process gas used when forming the first structure;

a parameter describing a position of the first object relative to the particle beam apparatus used for forming the first structure;

a parameter describing a orientation of the first object relative to the particle beam apparatus used for forming the first structure;

a parameter describing a vacuum pressure in a vacuum space containing the first object when forming the first structure;

a parameter describing a gas flow for avoiding charging of the first object when forming the first structure;

a parameter describing a temperature of the first object when forming the first structure;

a parameter describing an electrical potential of the first object relative to the particle beam apparatus when forming the first structure;

a parameter describing a crystal orientation of the first object relative to the particle beam apparatus when forming the first structure; and a parameter describing a change in a focus setting of the particle beam apparatus during the process of forming the first structure.

10. The method of claim 9, wherein the second structure comprises at least member selected from the group consisting of an identification symbol for a plurality of predetermined parameters and an identification symbol of the particle beam apparatus used for forming the first structure.

11. The method of claim 9, wherein the at least one parameter describing the particle beam used for forming the first structure comprises at least one of the following:

a parameter describing a kinetic energy of the particles of the particle beam that impinge on the object;

a parameter describing a beam current of the particle beam;

a parameter describing a diameter of the particle beam impinging on the object; and a parameter describing a working distance between the first object and the particle beam apparatus.

12. The method of claim 9, wherein the at least one parameter describing the process gas used when forming the first structure comprises at least one of the following:
- a parameter describing a chemical composition of the process gas;
- a parameter describing a pressure of the process gas; and
- a parameter describing a mass flow rate of the process gas.

13. The method of claim 1, wherein the second structure comprises at least member selected from the group consisting of an identification symbol for a plurality of predetermined parameters and an identification symbol of the particle beam apparatus used for forming the first structure.

14. The method of claim 1, wherein the at least one parameter describing the particle beam used for forming the first structure comprises at least one of the following:
- a parameter describing a kinetic energy of the particles of the particle beam that impinge on the object;
- a parameter describing a beam current of the particle beam;
- a parameter describing a diameter of the particle beam impinging on the object; and
- a parameter describing a working distance between the first object and the particle beam apparatus.

15. The method of claim 1, wherein the at least one parameter describing the process gas used when forming the first structure comprises at least one of the following:
- a parameter describing a chemical composition of the process gas;
- a parameter describing a pressure of the process gas; and
- a parameter describing a mass flow rate of the process gas.

16. The method of claim 1, further comprising:
- determining a multiplicity of sets of values of the first process parameters, wherein each set of values differs from each other set of values with regard to at least one of the values;
- forming a multiplicity of the first structures on the first object, wherein each of the structures is formed using a different set of values of the first process parameter; and
- forming a multiplicity of the second structures on the first object, wherein each of the second structures represents a different set of the values of the process parameters.

17. The method of claim 1, further comprising forming a multiplicity of first structures on one or more first objects using different first sets of the values of the first process parameters, wherein the method comprises:
- detecting the multiplicity of the first structures;
- comparing the detected first structures with the third structure to be formed on the second object, and selecting one of the first structures; and
- detecting the second structure assigned to the selected first structure, wherein a plurality of the second structures which are not assigned to selected first structures are not detected.

18. A method, comprising:
- determining, based on a first structure to be formed on a first object, a first set of values of a plurality of first process parameters of a particle beam apparatus;
- based on the first set of values of the first process parameters of the particle beam apparatus, using the particle beam apparatus to form the first structure on the first object;
- determining a second structure to be formed on the first object, the second structure being assigned to the first structure and representing the first set of values of the first process parameters;
- using the particle beam apparatus to form a second structure on the first object;
- detecting the second structure formed on the first object;
- analysing the detected second structure to determine the first set of values of the first process parameters represented by the detected second structure;
- determining a second set of values of the plurality of first process parameters based on the determined first set of values of the first process parameters; and
- based on the second set of values of the first process parameters, using the particle beam apparatus to form a third structure on the second object using the particle beam apparatus.

19. A method of structuring an object using at least one particle beam apparatus, the method comprising:
- determining a first structure to be formed on a first object;
- determining, based on the first structure, a first set of values of a plurality of first process parameters of the at least one particle beam apparatus;
- forming the first structure on the first object using the at least one particle beam apparatus using the first set of values of the first process parameters;
- determining a second structure to be formed on the first object, the second structure being assigned to the first structure and representing the first set of values of the first process parameters;
- forming the second structure on the first object using the at least one particle beam apparatus;
- determining a third structure to be formed on a second object;
- detecting the second structure formed on the first object;
- analysing the detected second structure and determining the first set of values of the first process parameters represented by the detected second structure;
- determining a second set of values of the plurality of first process parameters based on the determined first set of values of the first process parameters; and
- forming the third structure on the second object using the at least one particle beam apparatus using the second set of values of the first process parameters, wherein:
  i) the plurality of process parameters comprise at least one of the following:
  - a parameter describing the particle beam used for forming the first structure;
  - a parameter a describing a geometry of the first structure;
  - a parameter describing a writing field size used when forming the first structure;
  - a parameter describing a particle dose used for forming the first structure;
  - a parameter describing a spacing of scanning points used when forming the first structure;
  - a parameter describing a scan strategy used when forming the first structure;
  - a parameter describing a duration of a scan pass that is used when forming the first structure, the scan pass being carried out repeatedly;
  - a parameter describing a number of scan passes carried out repeatedly when forming the first structure;
  - a parameter describing a pause between successive scan processes that are used for forming the first structure;
  - a parameter describing a process gas used when forming the first structure;

a parameter describing a position of the first object relative to the particle beam apparatus used for forming the first structure;

a parameter describing a orientation of the first object relative to the particle beam apparatus used for forming the first structure;

a parameter describing a vacuum pressure in a vacuum space containing the first object when forming the first structure;

a parameter describing a gas flow for avoiding charging of the first object when forming the first structure;

a parameter describing a temperature of the first object when forming the first structure;

a parameter describing an electrical potential of the first object relative to the particle beam apparatus when forming the first structure;

a parameter describing a crystal orientation of the first object relative to the particle beam apparatus when forming the first structure; and a parameter describing a change in a focus setting of the particle beam apparatus during the process of forming the first structure;

ii) the second structure comprises at least member selected from the group consisting of an identification symbol for a plurality of predetermined parameters and an identification symbol of the particle beam apparatus used for forming the first structure;

iii) the at least one parameter describing the particle beam used for forming the first structure comprises at least one of the following:

a parameter describing a kinetic energy of the particles of the particle beam that impinge on the object;

a parameter describing a beam current of the particle beam;

a parameter describing a diameter of the particle beam impinging on the object; and a parameter describing a working distance between the first object and the particle beam apparatus;

iv) the at least one parameter describing the process gas used when forming the first structure comprises at least one of the following:

a parameter describing a chemical composition of the process gas;

a parameter describing a pressure of the process gas; and a parameter describing a mass flow rate of the process gas; and v) the method further comprises:

determining a multiplicity of sets of values of the first process parameters, wherein each set of values differs from each other set of values with regard to at least one of the values;

forming a multiplicity of the first structures on the first object, wherein each of the structures is formed using a different set of values of the first process parameter; and forming a multiplicity of the second structures on the first object, wherein each of the second structures represents a different set of the values of the process parameters.

20. The method of claim 19, further comprising forming a multiplicity of first structures on one or more first objects using different first sets of the values of the first process parameters, wherein the method comprises:

detecting the multiplicity of the first structures;

comparing the detected first structures with the third structure to be formed on the second object, and selecting one of the first structures; and detecting the second structure assigned to the selected first structure, wherein a plurality of the second structures which are not assigned to selected first structures are not detected.

* * * * *

UNITED STATES PATENT AND TRADEMARK OFFICE
CERTIFICATE OF CORRECTION

PATENT NO. : 9,905,395 B2  
APPLICATION NO. : 14/867304  
DATED : February 27, 2018  
INVENTOR(S) : Simon Stegmaier Page 1 of 1

It is certified that error appears in the above-identified patent and that said Letters Patent is hereby corrected as shown below:

In the Claims

Column 10, Line 54 (Claim 3): Delete "parameter a describing" and insert -- parameter describing --, therefor.

Column 11, Line 8 (Claim 3): Delete "a orientation" and insert -- an orientation --, therefor.

Column 12, Line 12 (Claim 9): Delete "parameter a describing" and insert -- parameter describing --, therefor.

Column 12, Line 33 (Claim 9): Delete "a orientation" and insert -- an orientation --, therefor.

Column 14, Line 47 (Claim 19): Delete "parameter a describing" and insert -- parameter describing --, therefor.

Column 15, Line 4 (Claim 19): Delete "a orientation" and insert -- an orientation --, therefor.

Signed and Sealed this  
Fifth Day of June, 2018

Andrei Iancu  
*Director of the United States Patent and Trademark Office*